Dec. 28, 1965 H. M. DORRER 3,225,995

MACHINE FOR AUTOMATIC APPLICATION OF CIRCUIT ELEMENTS, PREFERABLY OF PRINTED CIRCUITS

Filed Sept. 12, 1962 4 Sheets-Sheet 1

INVENTOR.
HERBERT MARTIN DORRER
BY Philip M. Bolton
ATTORNEY

INVENTOR.
HERBERT MARTIN DORRER
BY Philip M. Bolton
ATTORNEY

INVENTOR.
HERBERT MARTIN DORRER
BY Philip M. Bolton
ATTORNEY

INVENTOR.
HERBERT MARTIN DORRER
BY Philip M. Bolton
ATTORNEY

United States Patent Office 3,225,995
Patented Dec. 28, 1965

3,225,995

MACHINE FOR AUTOMATIC APPLICATION OF CIRCUIT ELEMENTS, PREFERABLY OF PRINTED CIRCUITS

Herbert Martin Dorrer, Muhlhausen, Pforzheim, Germany, assignor to International Standard Electric Corporation, New York, N.Y., a corporation of Delaware Filed Sept. 12, 1962, Ser. No. 223,222
Claims priority, application Germany, Sept. 14, 1961, St 18,323
3 Claims. (Cl. 227—85)

This invention relates to machines for cutting, forming and fastening components having oppositely extending flexible end portions, and, more particularly, to such a machine for cutting, forming and inserting the leads or lead bearing components in a printed circuit board.

Known machines of the aforementioned type utilize wire benders or formers, drift punches, and knives driven by a drive rod for effecting the cutting, bending and clamping of the leads. However, these machines place the circuit element directly on the printed circuit board without leaving a space between the component and the board. Spacing of the component from the board itself is often desirable for improved electrical, thermal, or mechanical characteristics.

It is therefore an object of this invention to provide a machine for cutting, forming and fastening components to a desired substrate in such a fashion that the components will be spaced apart from the substrate.

A feature of my invention is the provision of means for forming double shoulder shaped clamps in a portion of the leads themselves which maintain the components above the boards while affixing them thereto.

The above-mentioned and other features and objects of my invention will become more apparent by the following description taken in conjunction with the accompanying drawings, in which:

FIGURE 1 is a cross-sectional side elevational view of a machine in accordance with my invention;

FIGURES 2*a* and 2*b* are two cross-sectional views of FIGURE 1 taken along the line A–B showing two different positions of ball cup 15 juxtaposed for comparison;

Figure 1:
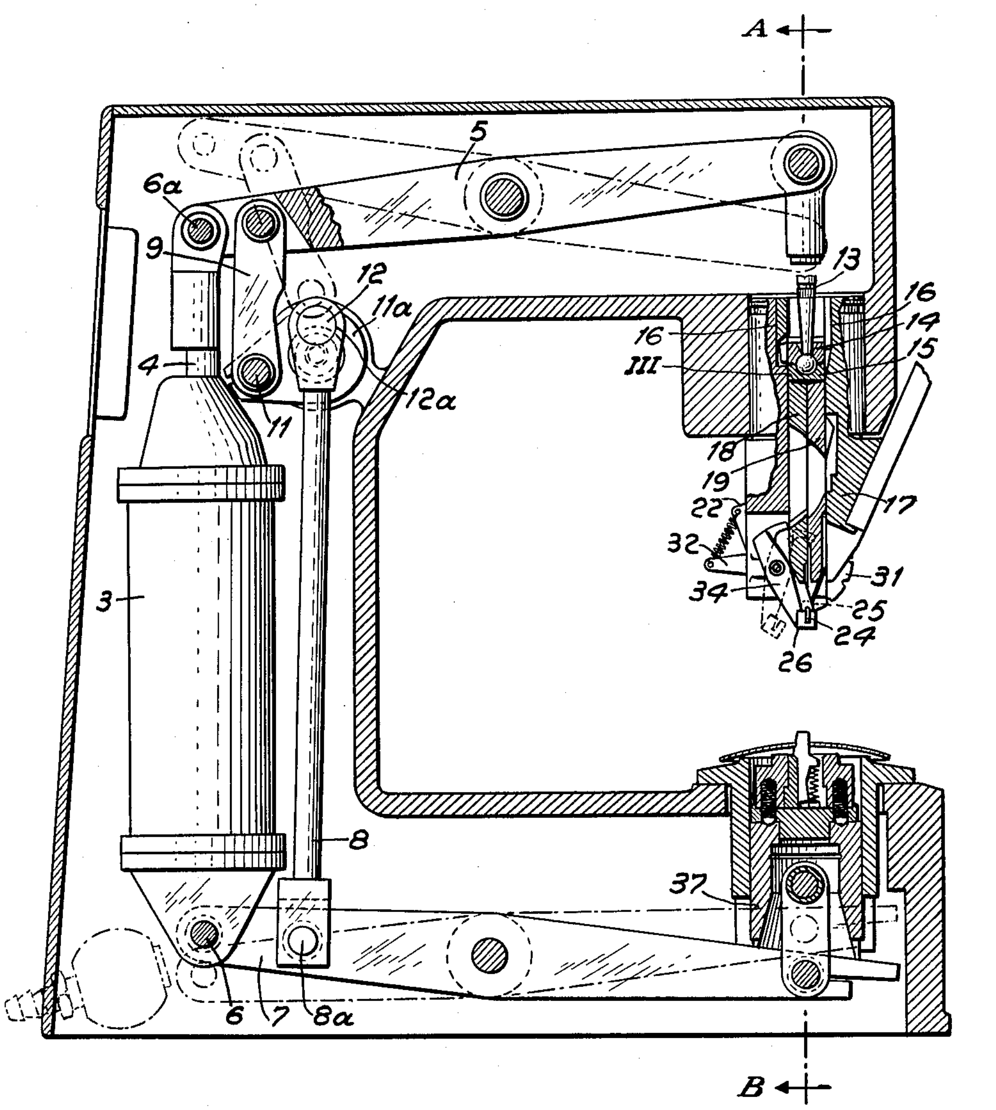

The machine of my invention can be powered, operated and controlled by any known means for manual or automatic operation—whichever is desired. Referring to the drawings, the machine is shown schematically in FIGURE 1.

Compressed air cylinder 3 comprises a piston rod 4 which is connected to lever 5 via axle 6*a*. The opposite end of the air cylinder is connected to lever 7 via axle 6. Air cylinder 3 is suspended within the housing of the machine; it is adapted to move piston rod 4 in vertical directions, and to impart reactive movement to lever 7. In order to effect desired movements of levers 5 and 7, which movements may be unequal, a control mechanism is provided. This mechanism comprises rod 8, connecting rod 9, crank 11*a*, axle 11, axle 8*a* and tenon 12 of crank 11*a* by which rod 8 is connected to crank 11*a* via mortise 12*a*. The particular means for effecting the movement of driving rod 13 which have thus far been broadly defined and for causing plunger 37 with the anvil chamber 38 (FIGURES 2*a* and 2*b*) to be moved vertically are not limited to the aforementioned means. Any means for accomplishing desired movements of rod 13 and plunger 37 and anvil chamber 38 in vertical directions can be used.

Figures 2A, 2B:
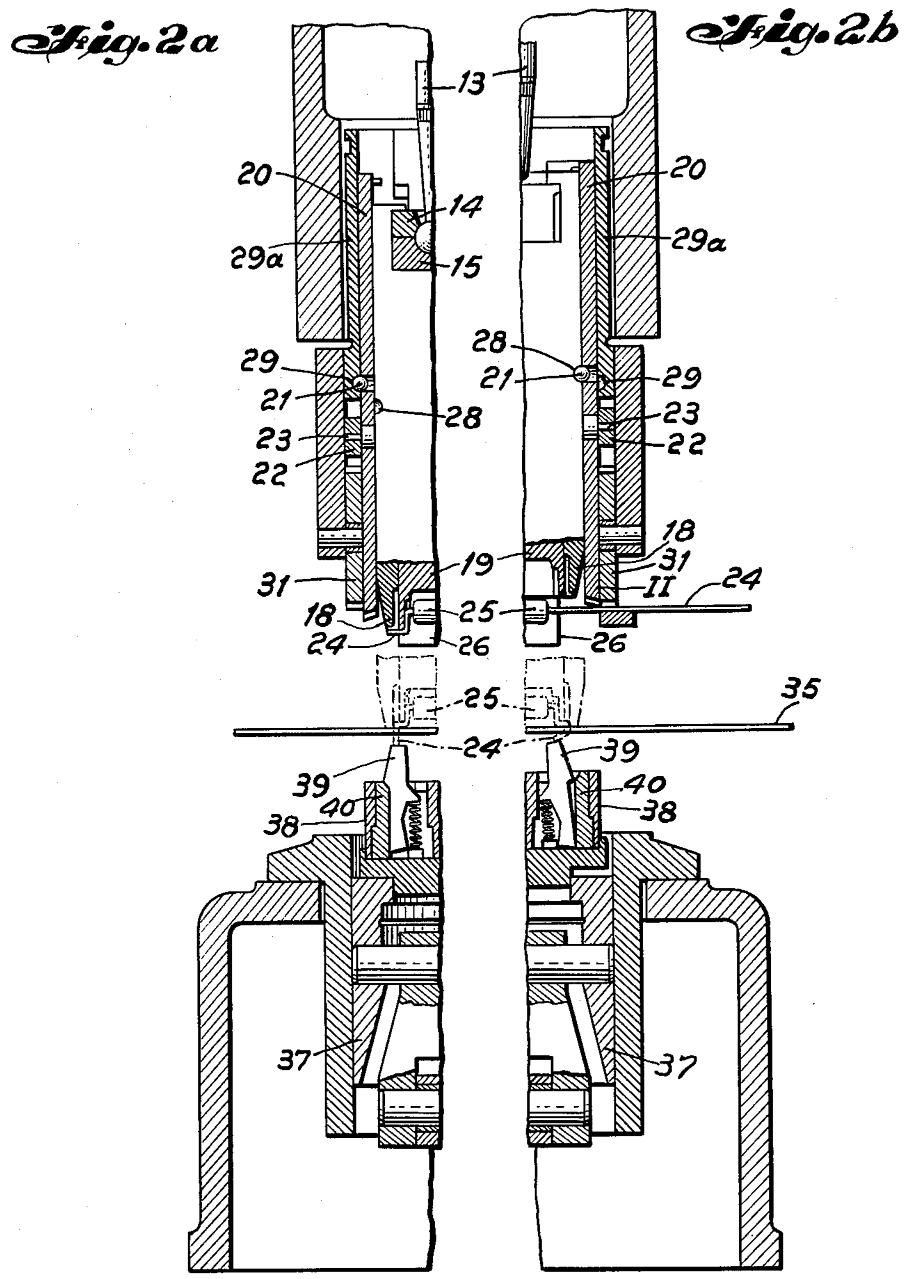
Figures 3, 4:
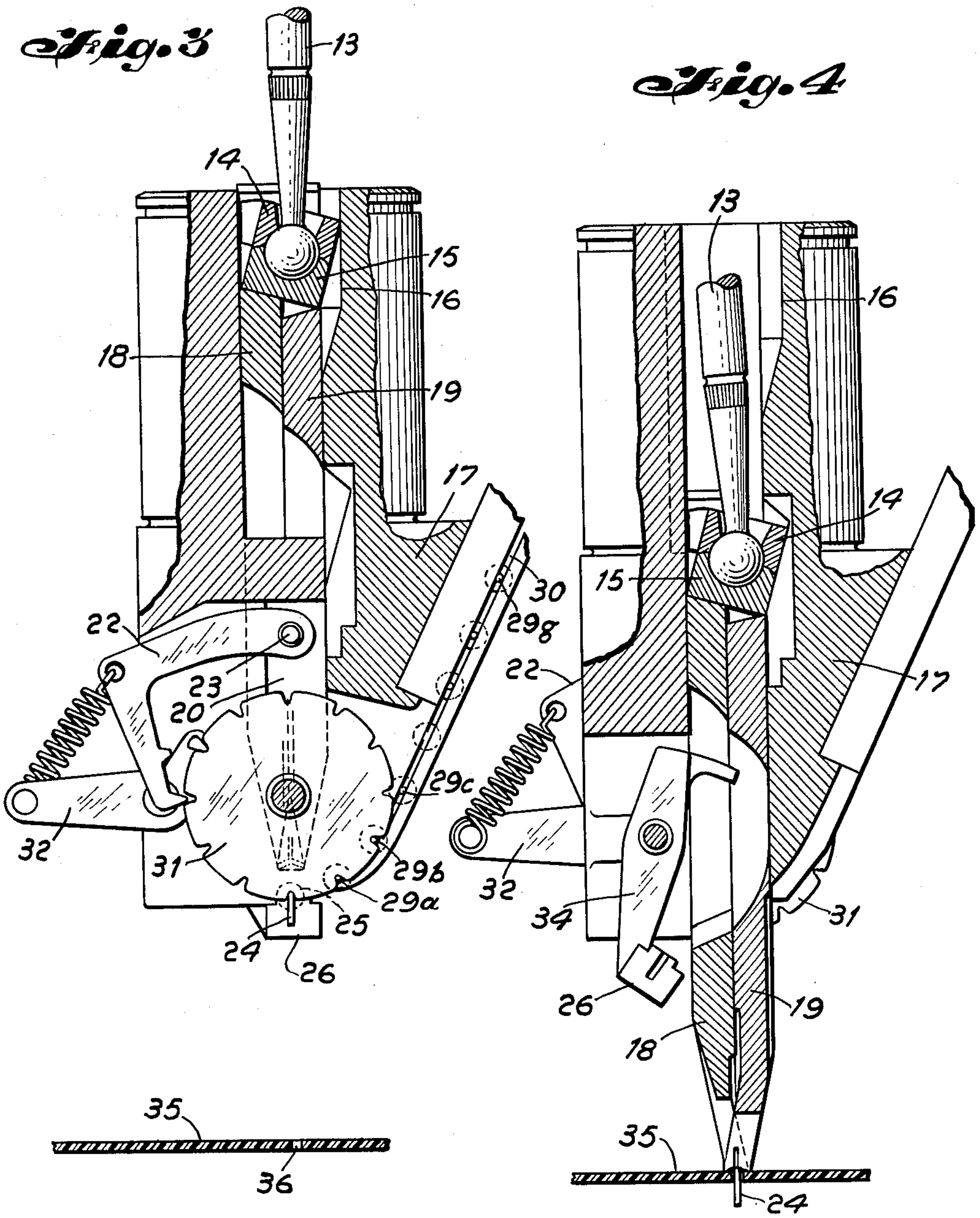
FIGURE 3 is a cross-sectional side elevational view of the forming head of the machine of FIGURE 1.
FIGURE 4 is a cross-sectional side elevational view of the forming head of the machine of FIGURE 1.

The lower ball shaped end of rod 13 lies in a rocker body formed by the ball cup cover 14 and the ball cup 15 itself. Movement of the rocker body in horizontal directions is controlled by the milled inner surface 16 of guide 17. The lower part of ball cup 15 rests upon the upper edges of a wire former 18 and driver 19. As can be seen in FIGURES 2*a* and 2*b*, knives 20 are coupled by means of detent balls 21 to former 18 and driver 19. Transporting arms 22 are rotatably connected to knives 20 via shaft 23 (FIGURE 3).

With the initial downward thrust of rod 13, ball cup 15 meets the inertial resistance of former 18 and driver 19. Therefore, as shown in FIGURE 3, the ball cup 15 moves downward. The various forces, including vibrational forces, acting on the ball cup tend to tilt it in different directions. However, within the guide 17, the ball cup has offered to it but on tilt direction. Free to move into the area presented by the milled inner surface 16, the ball cup 15 butts flush against the beveled end of former 18, and tilts in the attitude shown. This tilting, with the downward movement of the ball cup 15, moves one element, driver 19, before and ahead of the other element, former 18. This assures, as will be disclosed subsequently, the effective pressing of former 18 down against driver 19 to thereby bend the lead ends of the pigtail wires of the element to be mounted after knives have cut the wires to the desired length and before both former 18 and driver 19 clench the wires and lower the element towards the substrate. Both former 18 and driver 19, then, are moved downwards towards lead ends 24 of component 25 (shown as a resistor). The knives are caused to move downward due to the cooperation of detent balls 21 with former 18 and punch 19. Transporting arms 22 are also caused to participate in this movement due to their connection with knives 20. During this downward movement of rod 13, the leads 24 of component 25 are maintained in a horizontal plane due to the shape of bracket arm 26 upon which they have been disposed by wheel 31 via transport channel 30. Bracket arm 26 is rigidly affixed to the end of rocker arm 34, and rocker arm 34 is freely and pivotally mounted within and near the extreme end of guide 17. A lateral tongue at the upper end of rocker arm 34 rests against former 18, while former 18 is in its retracted position and while former 18 is partially extended. Subsequently, when former 18 is more fully extended, the lateral tongue moves into a recess in former 18 allowing the rocker arm 34 to pivot to a vertical position thereby withdrawing bracket arm 26. Knives 20 strike leads 24 during the initial machine movement cutting them to a desired length. In FIGURE 2*b* the position of the knives II just prior to cutting is shown, and in FIGURE 2*a* the position of the knives after the cutting operation has been accomplished and the first two forming operations have been completed is shown.

Once the cutting operation has been accomplished, movement of the knives is no longer desired. Further movement of the knives 20 is blocked as detent rollers 21 click out of openings 28 formed in the former and driver and into openings 29 formed in guide 17. Note the position of detent balls 21 in FIGURES 2*a* and 2*b*. This also stops the movement of transporting arms 22, rotatably secured to the knives by shaft 23, thus the arms ratch into wheel 31 through which the components 29*a*, 29*b*, etc. are led from transport channel 30 onto bracket arm 26. As can be seen in FIGURE 3, ratchet lever 32 is provided for blocking movement of wheel 31 during the downward movement of rod 13 so that a component can only be fed from the transport channel 30 to bracket arm 26 when the knives are moved upward a sufficient amount.

Figure 5:
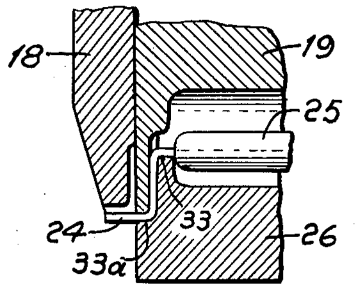
FIGURES 5–9 illustrate the various forms which the leads are caused to assume by a machine in accordance with my invention.
Figure 6:
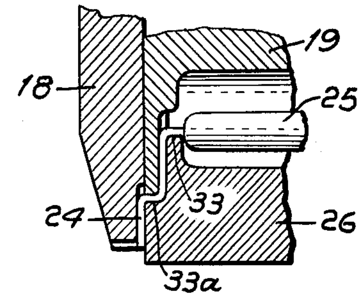

A further downward movement of rod 13 urges driver 19 against leads 24 so that they assume the S-shape shown in FIGURE 5 due to shoulders 33 of bracket 26. Also due to lower shoulders 33*a* of bracket 26 the leads are next caused to assume the shape shown in FIGURE 6 due to the movement of former 18 which forces the leads against the lower portions of bracket 26. The leads now have an upper shoulder on a plane with the component and a lower shoulder spaced below the component. It can be seen from the position which ball cup 15 now assumes (III, FIGURE 1) that this movement of former 18 is achieved in that both sides of ball cup 15 are forced into vertical planes due to the narrowing of guide 17 so that former 18 now advances ahead of driver 19 to effect the operation as shown in FIGURE 6. It is to be noted that prior to this, position I of ball cup 15 shown in FIGURE 3 had urged driver 19 more downward than former 18 so that the position shown in FIGURE 5 was attained.

Now that driver 19 and former 18 are in the positions shown in FIGURE 6, bracket 26 is moved out of contact with leads 24. This is automatically achieved due to the swinging of rocker arm 34 which pivotally supports bracket arm 26 into the recess of former 18 so that rocker arm 34 and bracket 26 assume the position shown in dotted lines in FIGURE 1.

Figure 7:
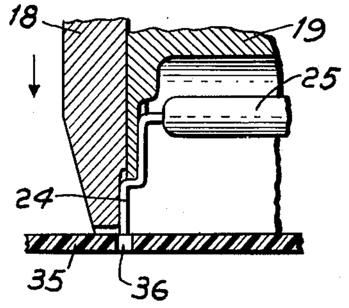
Figure 8:
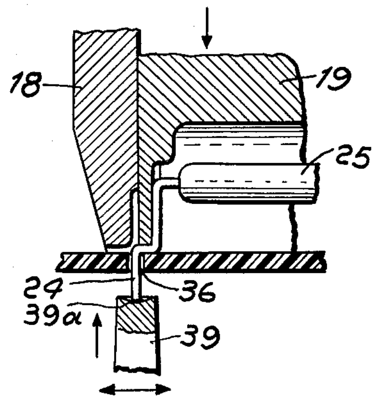

Now driver 19 and former 18 with component 25 held between them move toward substrate 35 (shown as a printed cricuit board in FIGURE 7). During this movement, the ball cup cover 14 moves into the position IV shown in FIGURE 4 with respect to guide 17 so that ball cup 15 is tilted again causing driver 19 to move downward relative to former 18 and press against the lower shoulders of leads 24 to urge the leads through holes 36 of substrate 35 so that the position shown in FIGURE 8 is now assumed.

Figure 9:
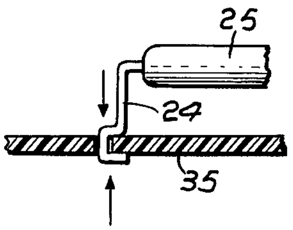
Figure 9A:
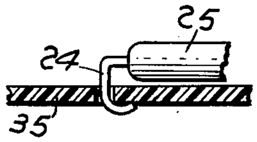

At this time, rod 13 has reached its extreme downward position and it is now desired to move plunger 37 and chamber 38 upwards in order to affect a crimping of the leads to the substrate. In the control mechanism illustrated connecting rod 9 will have now reached its extreme downward position so that the end of lever 5 which is positioned above rod 13 will have achieved its extreme downward position. Further movement of crank 11*a* will cause rod 8 to move downward via tenon 12 which engages mortise 12*a* so that lever 7 is now caused to pivot and move plunger 37 with anvil chamber 38 upward towards the position shown in dotted lines in FIGURE 1 and shown in the lower portions of FIGURES 2*a* and 2*b*. The ends of the leads are centered in funnel 39*a* of anvils 39 (FIGURE 8 and FIGURE 2*a*). Anvils 39 are caused to pivot and move in horizontal as well as vertical directions due to the chamfering of chamber 40 and the cooperation of the anvils therewith. The anvils thus press the wire ends towards the component to form C-shaped clamps with the lower shoulders of the leads as shown in FIGURE 9. As can be seen in FIGURE 9, the mounted component is spaced apart from the mounting board to provide easy access for wiring, improved electrical characteristics, and improved heat dissipating characteristics as compared with the conventional position of a component as is shown on the left in FIGURE 9. Further, the C-shaped form of the leads provides a larger area of contact with the substrate than the standard connection. The upper shoulders of the leads provides sufficient stability to the mounted component. Once the components have been mounted, dip soldering or other processes may be employed for improved mechanical coupling. Of course, the C-shaped clamp can be formed in any direction with respect to the component so that the C may be facing away from the component or at any angle with respect thereto. Also, the bottom of the C may be so disposed that an S rather than a C is formed. It is the cooperating shoulders which hold the components in the desired position no matter what shape is assumed by the leads.

It can be seen how wheel 31 advances, to feed a next component, and how bracket arm 26 returns to a receiving position, to accept the next component, upon the retraction of rod 13. That is, retraction of rod 13 causes the detent rollers 21 to click out of the openings 29 and return to the openings 28. Thus, former 18 and driver 19 are caused to withdraw into guide 17 with knives 20. The withdrawing of the knives operates transporting arms 22 to relieve the spring tension on ratchet lever 32 and to lift arms 22. In lifting, arms 22 ratch into and rotate wheel 31 to advance it one position. Simultaneously, former 18 and driver 19, withdrawing into guide 17, deflect the lateral tongue of rocker arm 34 outward. This returns bracket arm 26 to a position below guide 17 to receive the next component fed by the advance of wheel 31.

While I have described above the principles of my invention in connection with specific apparatus, it is to be clearly understood that this description is made only by way of example and not as a limitation to the scope of my invention as set forth in the objects thereof and in the accompanying claims.

I claim:

1. A machine for forming, inserting, and fastening leads of lead bearing components to substrates having holes therein, comprising: a source of power, an upper and lower driving rod, means coupling said source of power to said rods, said upper rod having a lower ball shaped end fitting into a tiltable rocker cup, a drift punch, a wire bender, the upper ends of said drift punch and wire bender being adapted to be engaged by said rocker cup and driven thereby, a member having a shoulder over which the leads of the components are bent, means including a guide controlling the tilt of the rocker cup to initially move the drift punch in advance of the wire bender downwards towards the leads to bend the leads once to form a first shoulder, then to advance the wire bender ahead of the drift punch to bend said leads again to form a second shoulder, and finally to advance both the drift punch and the wire bender to insert the lead ends into holes of the substrate, and a plunger having an anvil at its upper end and operated by said lower driving rod to bend the leads passing through said hole against said substrate.

2. A machine according to claim 1 further including a wheel for feeding components into operating position, and means controlled by said upper rod for blocking feeding movement of said wheel during downward motion of said upper rod and releasing said rod upon upward motion thereof.

3. A machine acording to claim 1 further including means controlled by said upper rod for moving said member having a shoulder out of the path of said drift punch and wire bender after the second shoulder has been formed.

References Cited by the Examiner

UNITED STATES PATENTS

| | | | |
|---|---|---|---|
| 2,834,963 | 5/1958 | Karinen | 1—323 |
| 2,896,213 | 7/1959 | Alderman et al. | 1—323 X |
| 2,902,691 | 9/1959 | Kwasniewski | 1—322 |
| 3,004,262 | 10/1961 | Cubbidge et al. | 1—323 |

GRANVILLE Y. CUSTER, Jr., *Primary Examiner.*